United States Patent
Norell et al.

[11] Patent Number: 6,105,851
[45] Date of Patent: Aug. 22, 2000

[54] METHOD OF CASTING I/O COLUMNS ON AN ELECTRONIC COMPONENT WITH A HIGH YIELD

[76] Inventors: Ronald Allen Norell, 4581 Fieldgate Rd., Oceanside, Calif. 92056; Kenneth Walter Economy, 252 Silvercreek Glen, Escondido, Calif. 92029

[21] Appl. No.: 09/132,026

[22] Filed: Aug. 7, 1998

[51] Int. Cl.$^7$ .......................... B23K 35/12; B23K 31/00; B23K 31/02; B23K 35/14
[52] U.S. Cl. .................... 228/245; 228/180.22; 228/56.3
[58] Field of Search ................... 228/245, 254, 228/180.21, 180.22, 14, 56.3

[56] References Cited

U.S. PATENT DOCUMENTS

| | | | |
|---|---|---|---|
| 4,914,814 | 4/1990 | Behun et al. | 29/843 |
| 5,244,143 | 9/1993 | Ference et al. | 228/180.21 |
| 5,484,964 | 1/1996 | Dawson et al. | 174/261 |
| 5,579,205 | 11/1996 | Tustaniwskyj et al. | 361/704 |
| 5,658,827 | 8/1997 | Aulicino et al. | 228/180.22 |
| 5,718,361 | 2/1998 | Braun et al. | 228/56.3 |
| 5,718,367 | 2/1998 | Covell, II et al. | 228/254 |
| 5,735,452 | 4/1998 | Yu et al. | 228/254 |
| 5,838,545 | 11/1998 | Clocher et al. | 361/719 |
| 5,913,985 | 6/1999 | Lei et al. | 134/34 |

*Primary Examiner*—Patrick Ryan
*Assistant Examiner*—C. Newsome
*Attorney, Agent, or Firm*—Charles J. Fassbender; Mark T. Starr; Steven B. Samuels

[57] ABSTRACT

I/O columns are cast on the I/O pads of an electronic component via a process which uses a template that has a set of alignment holes, and a set of casting holes, and an additional set of pin holes that are interspersed with the casting holes. Initially, the template is placed in a fixture such that the casting holes align with the I/O pads of the electronic component. Next, the template is covered with a mask that exposes all of the casting holes but blocks all of the pin holes. Then the exposed casting holes in the template are filled with a solid metallic material. Next the mask is removed, and the metallic material in the casting holes is melted and re-solidified to thereby form the I/O columns on the I/O pads. Then the electronic component with its I/o columns is separated from the template by pushing on the component with pins that are passed through the pin holes in the template. Since the pin holes are interspersed with the casting holes, the electronic component is pushed away from the mask without bending the template. Consequently, the I/O columns do not bind in the casting holes; and thus they do not break as they pushed from the template.

15 Claims, 6 Drawing Sheets

METHOD OF CASTING I/O COLUMNS ON AN ELECTRONIC COMPONENT WITH A HIGH YIELD

BACKGROUND OF THE INVENTION

This invention relates to methods of casting input/output columns (I/O columns) on the input/output pads (I/O pads) of an electronic component; and more particularly, this invention provides an improved method of casting I/O columns on the I/O pads of an electronic component which enhances yield by greatly reducing breakage of the I/O columns as they are removed from a casting template.

In the prior art, one method for casting I/O columns on the I/O pads of an electronic component is described in U.S. Pat. No. 5,454,159 which is assigned to the assignee of the present invention. There, a process for casting I/O columns on the I/O pads 21 of an electronic component 20 is shown in FIGS. 1–7. Typically, the electronic component 20 is an integrated circuit package which holds one or more integrated circuit chips.

All of the I/O columns in patent '159 are cast the by using a template 40 which that patent shows in FIG. 5. This template 40 has a set of alignment holes which are indicated by reference numerals 41a and 41b, and it has a set of casting holes which are indicated by reference numeral 42. The alignment holes 41a and 41b are used to hold the template 40 at a particular position in a fixture 10, and the casting holes 42 are used to cast the columns on the I/O pads of the electronic component.

In patent '159, the casting step is shown in FIGS. 6 and 7. Then, the I/O columns are removed from the template in a conventional fashion by grasping the electronic component on one pair of edges, grasping the template on another pair of edges, and pulling them apart. However, such pulling must be done with extreme care because the I/O columns are microscopic in size and thus they can easily break.

Typically, the total number of I/O columns on a single electronic component is over four hundred. If a single one of those columns breaks, then the component must be scraped; or, all of the I/O columns must be stripped from the component and the entire casting process must be repeated.

In a mass production environment, the above problem will be catastrophic if it occurs too frequently. This is because all of the components that are scraped or reworked add to the overall cost of manufacturing the products that actually get shipped to a customer. If that overall cost gets too high, the product will fail in the market place.

Accordingly, a primary object of the present invention is to provide an improved method of casting I/O columns on the I/O pads of an electronic component which enhances yield by avoiding the above problem.

BRIEF SUMMARY OF THE INVENTION

With the present invention, I/O columns are cast on the I/O pads of an electronic component via a novel process which uses a template that has a set of alignment holes, and a set of casting holes, and an additional set of pin holes that are interspersed with the casting holes.

Initially, the template is placed in a fixture such that the casting holes align with the I/O pads of the electronic component. Next, the template is covered with a mask that exposes all of the casting holes but blocks all of the pin holes. Then the exposed casting holes in the template are filled with a solid metallic material. Next the mask is removed, and the metallic material in the casting holes is melted and re-solidified to thereby form the I/O columns on the I/O pads.

Then the electronic component with its I/o columns is separated from the template by pushing on the component with pins that are passed through the pin holes in the template. Since the pin holes are interspersed with the casting holes, the electronic component is pushed away from the mask without bending the template. Consequently, the I/O columns do not bind in the casting holes; and thus they do not break as they pushed from the template.

By comparison, when the electronic component is removed from the template in a conventional manner by pulling on the edges of the component and the edges of the template, then the template has a tendency to bend. This bending occurs because all of the casting holes in the template inherently make the template weak. But, bending the template will bind the I/O columns against the side walls of the casting holes; and thus the I/O columns will break as they are pulled from the template.

DETAILED DESCRIPTION

Figure 1:
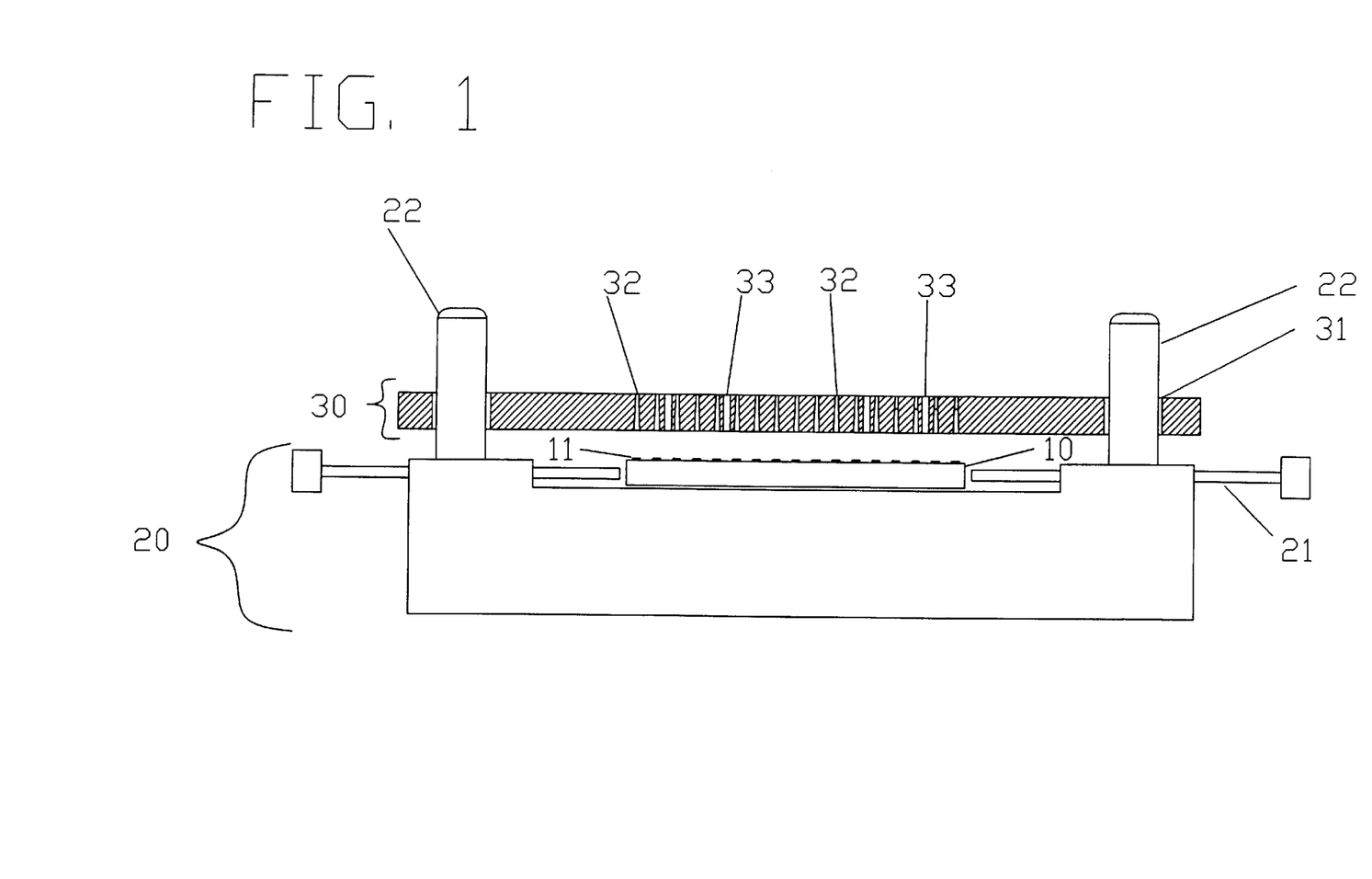
FIG. 1 shows an initial step in one preferred process by which I/O columns are cast on the I/O pads of an electronic component via the present invention.

In FIG. 1, reference numeral 10 identifies an electronic component which has a plurality of I/O pads 11; and, I/O columns are to be cast on these I/O pads in accordance with the present invention. These I/O pads 11 are shown in FIG. 1 with a size and a spacing that is greatly magnified, because their actual size and spacing is microscopic.

For example, in one particular embodiment, each I/O pad is a round piece of metal that is thirty mils in diameter, and all of the I/O pads are arranged in an array of rows and columns on fifty mil centers. Also, the total number of I/O pads 11 on the electronic component 10 is usually between four-hundred and fourteen-hundred.

In FIG. 1, the electronic component 10 is held in a fixture 20 by four screws 21, only two of which are shown. Each screw 21 pushes on a respective side of the electronic component 10; and that enables the electronic component 10 to be held at various locations in the fixture 20.

Further in FIG. 1, the electronic component 10 is covered with a template 30. This template 30 is made of a material which can withstand high temperatures, such as 400° C.–900° C., and which has a thermal expansion coefficient that closely matches the thermal expansion coefficient of the electronic component 10. For example, if the electronic component is a ceramic integrated circuit package, then the template 30 may be made of graphite.

Now, in accordance with the present invention, the template 30 has three sets of holes which are respectively indicated by reference numerals 31, 32, and 33. All of the holes 31 are alignment holes which hold the template 30 in one position on the fixture 20; all of the holes 32 are casting holes in which respective I/O columns are cast on the I/O pads 11; and all of the holes 33 are pin holes. These pin holes 33 are used to separate the electronic component 10 and I/O columns from the template 30 in a novel fashion such that the I/O columns do not break; and how this separating step is performed will be described shortly in conjunction with FIG. 4.

Figure 2:
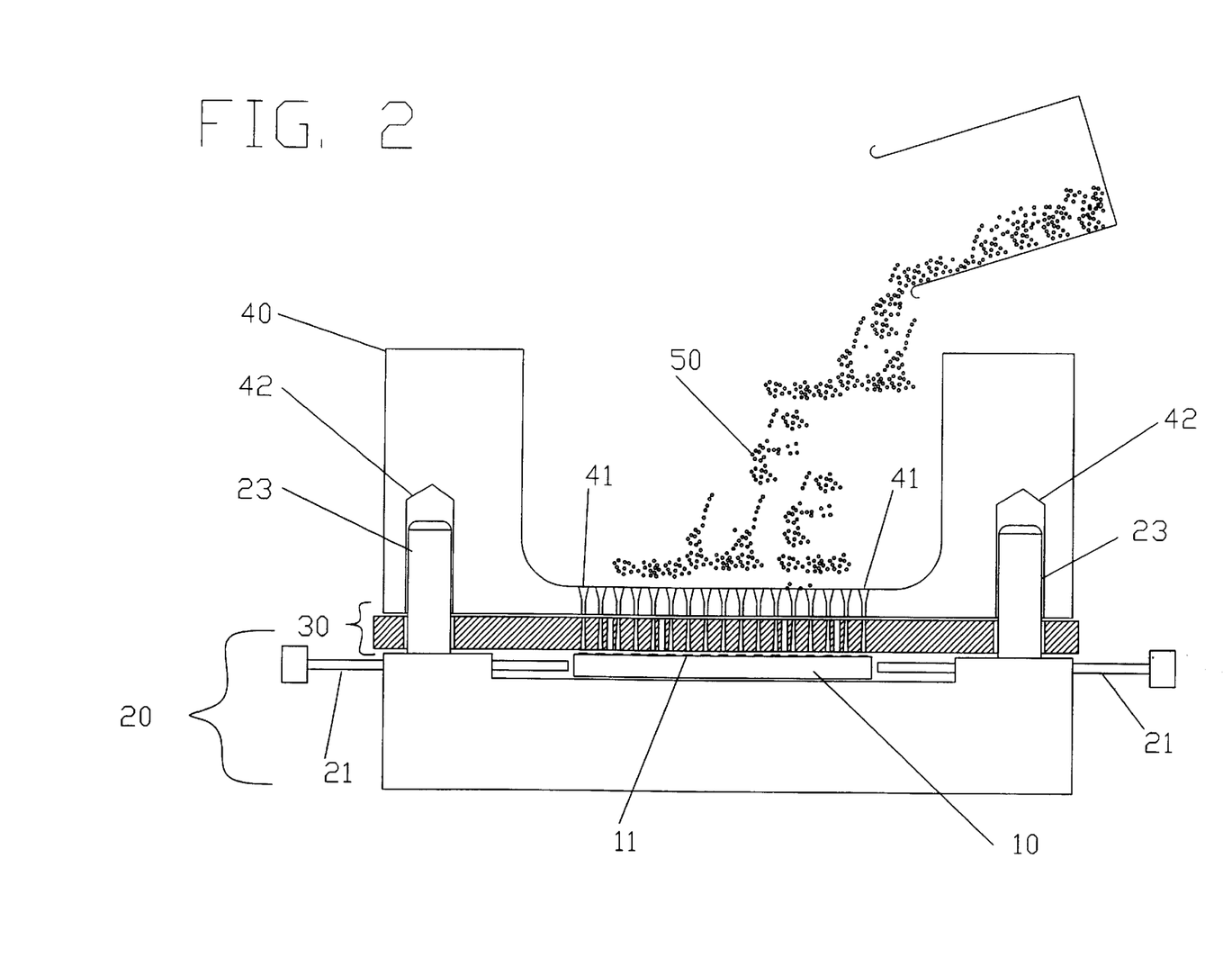
FIG. 2 shows a second step in the above preferred process.

In FIG. 1, the screws 21 position the electronic component 10 in the fixture such that the I/O pads 11 are aligned with the casting holes 32. Thereafter, a tub-shaped mask 40 is placed on top of the template 30 as shown in FIG. 2. This mask has a set of alignment holes 41 and another set of holes 42 which match the casting holes 32 in the template 30.

When the mask 40 is placed on the template 30 such that the posts 22 are in the alignment holes 41, then the I/O pads 11 are exposed through the holes 42 in the mask and the casting holes 32 in the template. But at the same time, the pin holes 33 are blocked by the mask 40.

Thereafter, as is shown in FIG. 2, the tub-shaped mask 40 is partially filled with solder balls 50. These solder balls are then moved around until all of the template holes 32 are filled.

Figure 3:
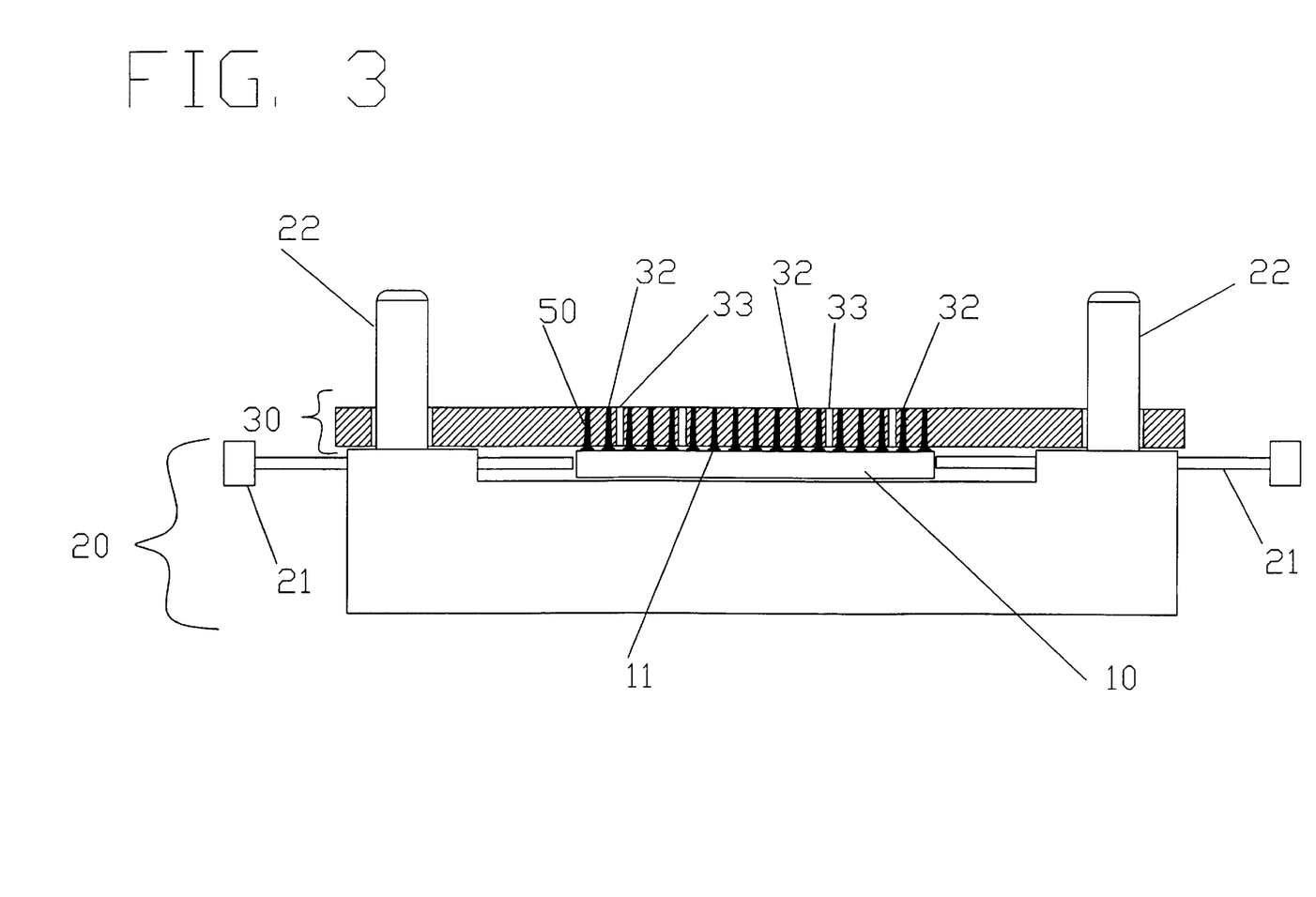
FIG. 3 shows a third step in the above preferred process.

Next, the mask 40 is removed from the fixture 20, and the resulting assembly is shown in FIG. 3. Then, the FIG. 3 assembly is sent through a belt furnace (not shown) wherein the solder balls 50 are melted. This forms a cylindrical column of liquid solder in the template holes 42 on top of each of the I/O pads 11.

Thereafter, the liquid solder is cooled which causes it to re-solidify and thereby form respective I/O columns that are attached to the I/O pads 11. These I/O columns are identified in FIGS. 4 and 5 by reference numeral 50'.

Figure 4:
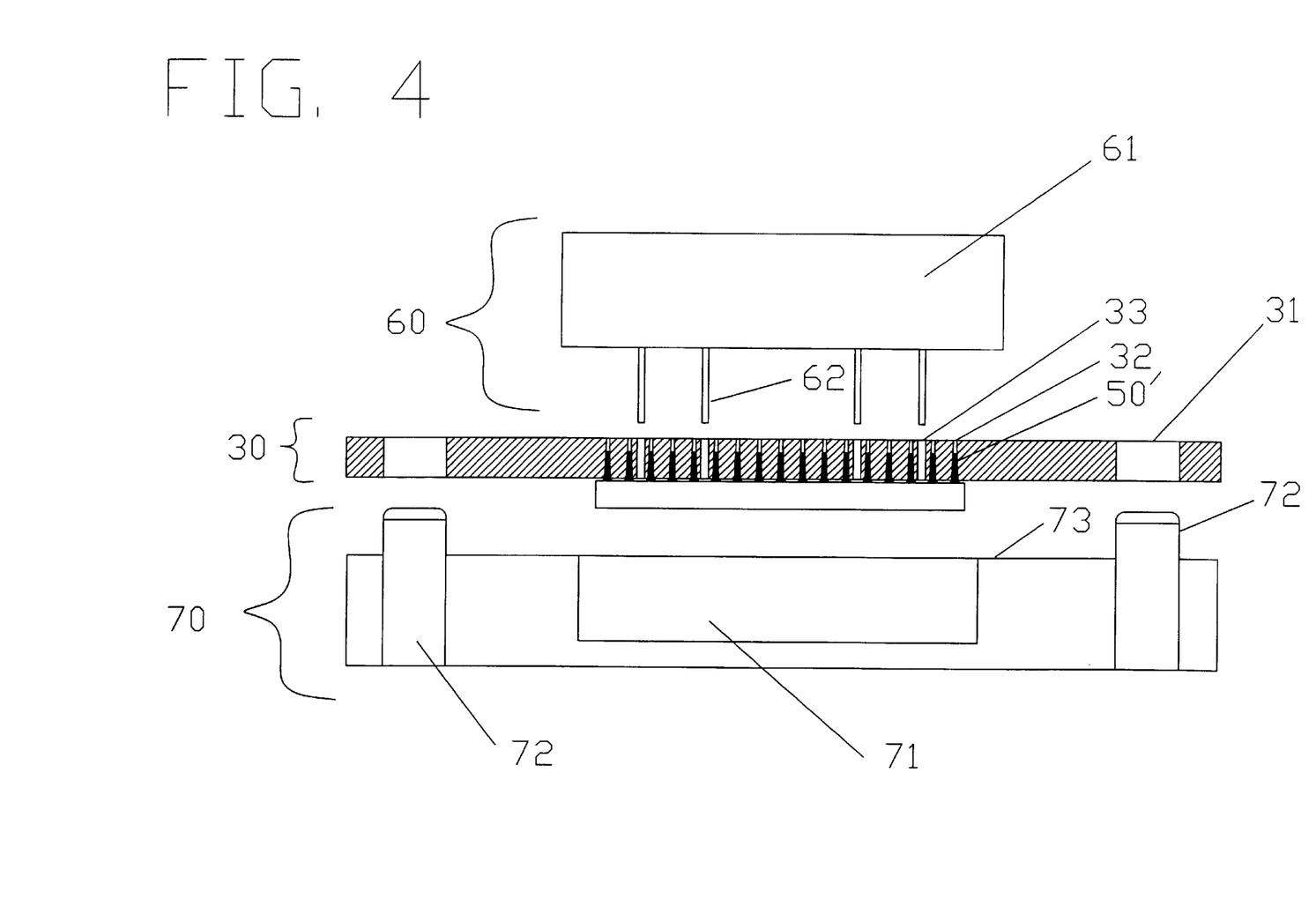
FIG. 4 shows a fourth step in the above preferred process.
Figure 5:
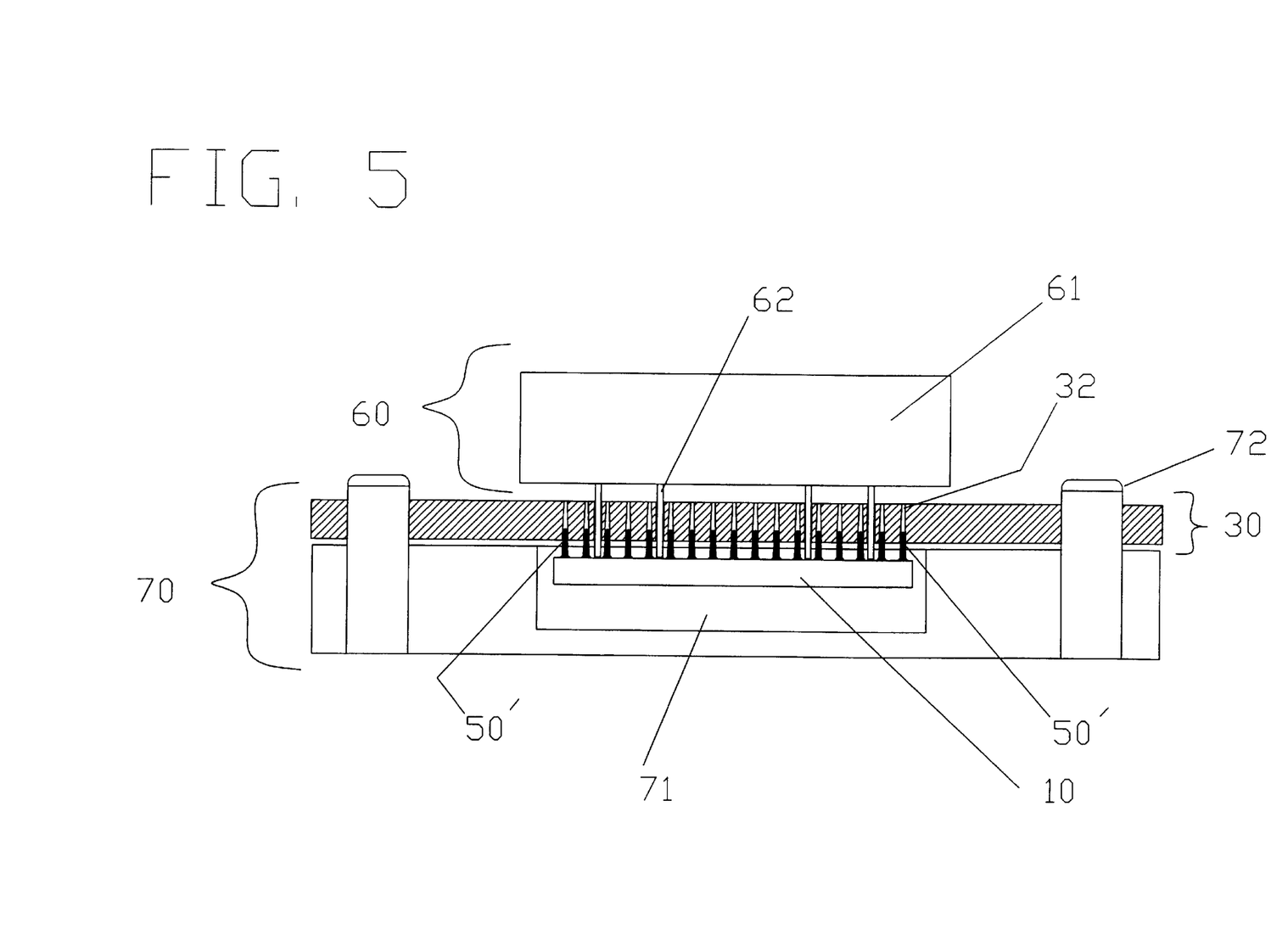
FIG. 5 shows a fifth step in the above preferred process.

Following the above operation, the electronic component 10 together with the template 30 are removed from the fixture 20. Then, by using the holes 33 in the template 30, the electronic component 10 and its attached I/O columns are separated from the template 30, and this step is illustrated in FIGS. 4 and 5.

There, reference numeral 60 identifies a pin block which has a body 61 and has a set of pins 62. All the pins 62 extend from the body 61 such that they fit into the holes 33 of the template 30. Also in FIGS. 4 and 5, reference numeral 70 identifies another fixture which has a central cavity 71 and a set of posts 72 that fit into the holes 31 of the template 30.

To separate the electronic component 10 from the template 30, that template 30 is initially placed on the fixture 70 such that the posts 72 are in the alignment holes 31. In that position, the template 30 is supported by a surface 73 on the fixture 70 which surrounds the cavity 71, and the electronic component 10 lies within the central cavity 71 of the fixture.

Next, while the template 30 is on the fixture 70, the pins 62 of the pin block 60 are inserted into the pin holes 33 of the template 30. Then, the open ends of the pins 62 are moved completely through the pin holes 33 and pushed against the electronic component 10. This step, as shown in FIG. 5, moves all of the solder columns 50' completely out of the template 30.

Preferably, the pin holes 33 in the template 30 are interspersed with the casting holes 32. This enables the electronic component 10 to be pushed away from the template 30 without bending the template. If the template 30 is allowed to bend, the solder columns 50' will bind against the side walls of the casting holes 32, and that will cause one or more of the solder columns 50' to break when they are moved by the pins.

One particular example of how the pin holes 33 are interspersed with the casting holes 32 is shown in FIG. 5. There, the casting holes 32 are arranged in a plurality of spaced-apart rows and columns, and the pin holes 33 are located in the space between the rows and columns. In FIG. 5, the total number of casting holes 33 is six-hundred twenty-five, and the total number of pin holes 33 is sixteen.

By experiment, the inventors have found that when the template 30 of FIG. 5 is used to cast six-hundred twenty-five solder columns on the electronic component 10, the force which must be exerted on the pin block 60 to push those columns out of the template 30 ranges from fifty to one-hundred pounds. Such a large force can easily crack or break the solder columns on the electronic component 10 if the template is allowed to bend. To confine the bending of the template 30 to an acceptable level, the total number of pin holes 33 in the template 30 preferably is at least 1% of the total number of casting holes 32.

While the pins 62 push against the electronic component 10, the template 30 preferably is supported all around the electronic component. In FIGS. 4 and 5, this support is provided by surface 73 of the fixture 70. By comparison, if the template is supported on only two sides of the electronic component 10, then the template has a tendency to bow from one supported side to the other.

One preferred method for manufacturing I/O columns on the I/O pads of an electronic component, in accordance with the present invention, has now been described in detail. In addition however, various changes and modifications can be made to the details of this preferred method without departing from the nature and spirit of the invention.

For example, the casting holes 32 in template 30 can be arranged in any pattern, and there can be any number of casting holes in the template. As the total number of I/O columns on a component is increased, the force which is required to separate that component from the template increases; and thus the need to use the present invention to enhance yield increases. But, even when the total number of I/O columns of a component is just four hundred, the force which is required to separate it from the template will be at least twenty pounds, and that is large enough to bend the component and/or the template.

Figure 6:
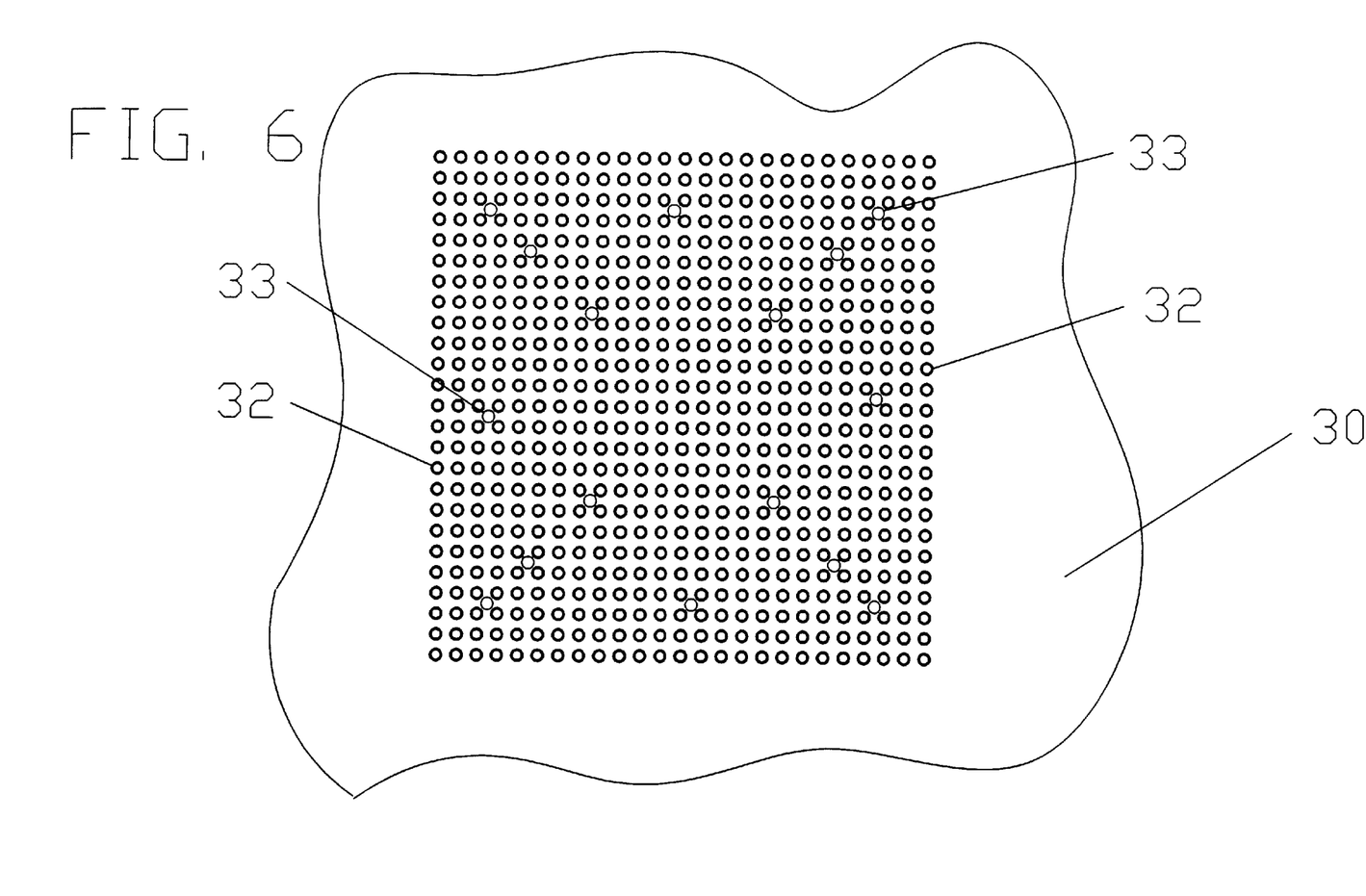
FIG. 6 shows one particular embodiment of a template which enables the process of FIGS. 1–5 to be performed.

Also, the pin holes 33 in the template 30 can be interspersed with the casting holes 32 in any pattern which reduces the bending of the electronic component 10 to an acceptable level. For example, if the space between the rows and columns in FIG. 6 is too small for the pin holes 33, then some of the casting holes 32 can be deleted and replaced with the pin holes 33. With this modification, all of the I/O pads 11 that correspond to the deleted casting holes 32 will also have to be deleted on the electronic component 10.

As another modification, the fixture 70 can be changed such that it supports the template 30 at multiple spaced apart areas, rather than a single area, around the electronic component 10. With this modification, the multiple spaced apart areas need to be sufficiently close together to prevent the template 30 from bending.

Also, as another modification, the material 50 from which the I/O columns on the electronic component 10 are made is not limited to solder. Instead, those I/O columns can be made of any metal, such as copper for example. Similarly, the initial shape of the material 50 as it fills the template 30 is not limited to a ball shape; but instead, the material 50 can have any initial shape that will pass through the holes 41 of the mask 40.

Accordingly, it is to be understood that the present invention is not limited to just the one preferred method which is illustrated in the figures, but is defined by the appended claims.

What is claimed is:

1. A method of casting I/O columns on I/O pads of an electronic component; said method including the steps:

providing a template with casting holes that match said I/O pads, and with pin holes that are interspersed among said casting holes;

placing said template on said component such that said casting holes align with said I/O pads;

covering said template with a mask that exposes said casting holes but blocks said pin holes;

filing the exposed casting holes in said template, and not said blocked pin holes, with a solid metallic material;

melting and re-solidifying said metallic material in said casting holes to thereby form said I/O columns on said I/O pads; and thereafter, exposing said pin holes by removing said mask from said template; and, separating said component, with said I/O columns attached thereto, from said template by pushing on said component with pins that are passed through said pin holes.

2. A method according to claim 1 wherein the total number of pin holes in said template is at least 1% of the total number of casting holes in said template.

3. A method according to claim 1 wherein said casting holes are arranged in spaced apart rows and columns, and said pin holes lie in the space between said rows and columns.

4. A method according to claim 1 wherein said casting holes are arranged in spaced apart rows and columns, and said pin holes are at selected locations in said rows and columns.

5. A method according to claim 1 wherein the total number of casting holes in said template is at least four hundred.

6. A method according to claim 1 wherein during said separating step, said I/O columns resist being pushed from said template with a force of at least twenty pounds.

7. A method according to claim 1 wherein during said separating step, said template is held by a fixture which supports said template in a single area that completely surrounds said component.

8. A method according to claim 1 wherein during said separating step, said template is held by a fixture which supports said template in multiple spaced apart areas that surround said component and are sufficiently close together to prevent said component from bending when pushed by said pins.

9. A method according to claim 1 wherein all of said pins are held by and extend from a base of a single pin block.

10. A method according to claim 1 wherein said metallic material is solder.

11. A method according to claim 1 wherein said metallic material is copper.

12. A method according to claim 2 wherein the total number of casting holes is at least four hundred.

13. A method according to claim 12 wherein during said separating step, said I/O columns resist being pushed from said template with a force of at least twenty pounds.

14. A method according to claim 13 wherein during said separating step, said template is held by a fixture which supports said template at a single area that completely surrounds said component.

15. A method according to claim 13 wherein during said separating step, said template is held by a fixture which supports said template at multiple spaced apart areas that surround said component and are sufficiently close together to prevent said component from binding when pushed by said pins.

* * * * *

UNITED STATES PATENT AND TRADEMARK OFFICE
CERTIFICATE OF CORRECTION

PATENT NO. : 6,105,851

DATED : August 22, 2000

INVENTOR(S) : Ronald Allen Norell, et al

It is certified that error appears in the above-identified patent and that said Letters Patent is hereby corrected as shown below:

On the Title Page, insert Item [73] Assignee, ------ Unisys Corporation, Blue Bell, Pa -----.

Signed and Sealed this

Twenty-ninth Day of May, 2001

*Attest:*

NICHOLAS P. GODICI

*Attesting Officer*   *Acting Director of the United States Patent and Trademark Office*